United States Patent [19]
Johnsson

[11] Patent Number: 4,742,398
[45] Date of Patent: May 3, 1988

[54] APPARATUS IN VIDEO DISPLAY TERMINALS

[76] Inventor: Bengt Johnsson, Larsbergsvägen 42, S-181 38 Lidingö, Sweden

[21] Appl. No.: 871,431
[22] PCT Filed: Sep. 18, 1985
[86] PCT No.: PCT/SE85/00356
 § 371 Date: May 23, 1986
 § 102(e) Date: May 23, 1986
[87] PCT Pub. No.: WO86/01910
 PCT Pub. Date: Mar. 27, 1986

[30] Foreign Application Priority Data

Sep. 24, 1984 [SE] Sweden .................. 8404766

[51] Int. Cl.⁴ .............................................. H04N 5/65
[52] U.S. Cl. ........................... 358/245; 358/249; 358/254
[58] Field of Search ............... 358/248, 252, 255, 254, 358/249; 312/7.2 TY; 350/299; 378/158

[56] References Cited

U.S. PATENT DOCUMENTS 4,360,836 11/1982 Breck et al. .................. 358/245
4,444,465 4/1984 Giulie et al. .................. 350/276 R

FOREIGN PATENT DOCUMENTS 67270 10/1984 Finland.

*Primary Examiner*—Edward L. Coles, Sr.
*Attorney, Agent, or Firm*—Hill, Van Santen, Steadman & Simpson

[57] ABSTRACT

Apparatus for viewing the image screen on a video display unit in which the unit itself is mounted in radiation-protective casing, there being another casing over the image screen itself, and including mirroring means for deflecting the light rays transversely for viewing through a lens. The casings are formed of radiation-screening material.

6 Claims, 1 Drawing Sheet

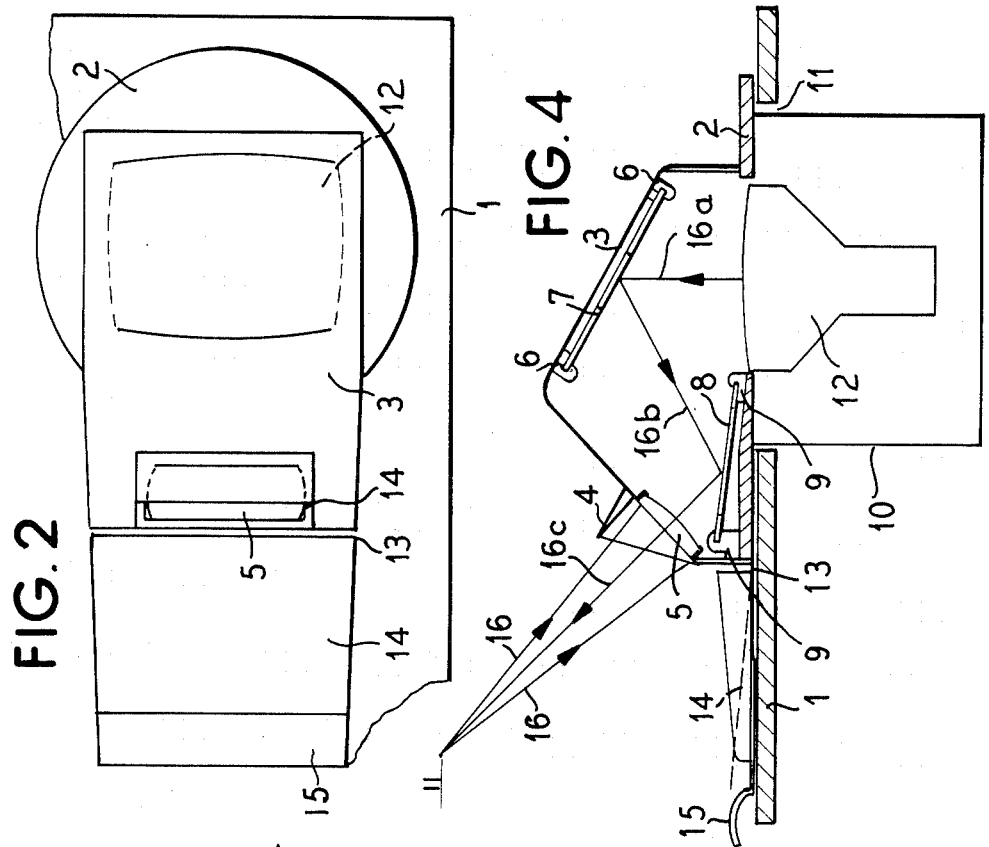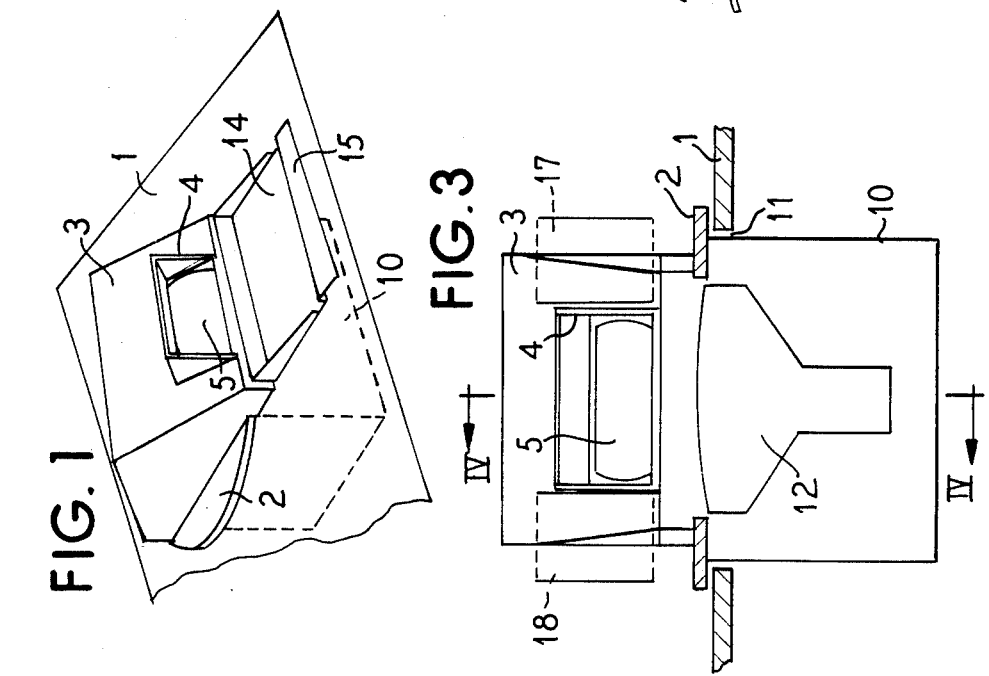

APPARATUS IN VIDEO DISPLAY TERMINALS

FIELD OF THE INVENTION

Apparatus for viewing an image on a cathode ray tube.

PRIOR ART

Video display terminals (VDT's) at present usually comprise video display unts (VDU's), which may be set up on a desk and coupled to a keyboard which may be placed in front of the unit. Such VDU's generally take up large space and they must be viewed at a suitable reading distance for the information thereon to be apprehended. This often results in that operators who have to wear spectacles often need to use spectacles especially suited solely to reading the VDU. However, it often happens that the operator views the VDU at very close range instead of using spectacles, which is not to be recommended from the ophthalmic as well as the ergonomic aspect. Operators who do not wear spectacles often have sight problems also, which primarily depends on the fact that the human eye is poorly suited to focusing objects which emit light.

It is also known that VDU's generate pulsing long-wave electro magnetic radiation and that they are surrounded by magnetic fields. It cannot be ignored that these factors can detrimentally affect the operator's health. An industrial medicine evaluation of the risks in question is still lacking today, and is difficult to carry out, since it is difficult to identify study conditions and long-term tests. The risks have been particularly pointed out with regard to pregnant women and women of childbearing age. It has been further pointed out that unease and uncertainty with regard to the risks can be a health risk in itself. This uncertainty, in combination with the implementation of the workplace can generally result in that the operator chooses a greater viewing distance than that required by the size of the symbols. The urge to distinguish details results in that the accommodation of the eye will be greater than the corresponding converging angle. This is, of course, tiresome for the eyes andcan give rise to discomfort and a state of tension.

A VDU is generally placed where it is well visible at the workplace in question, resulting in that unauthorized viewing is difficult to prevent. This means that information can leak out to unauthorized persons, which is extremely unsatisfactory from the aspect of industrial espionage, for example. Even if the display surface itself is screened off, this measure will not be particularly effective, since there are always oblique angles from which the display surface can be viewed. Furthermore, a VDT can be easily electronically searched by unauthorized persons, since it sends revealing signals. This is very unsatisfactory from the security aspect.

It may be pointed out that in this connection, that image transmission using mirroring from a VDU mounted under the operator's desk surface is known from the Finnish published specification No. 67,270. A simple raisable mirror is used to make the content on the VDU screen visible to the operator.

SUMMARY OF THE INVENTION

The present invention relates to a solution which can effectively prevent injurious radiation as well as revealing signals, and which furthermore has viewing conditions such that substantially only the operator can base the content on the display surface. An apparatus in accordance with the invention is based on the transfer of images from the VDU to the operator via an optical image transfer system for viewing in a transverse direction in relation to the VDU. What is essentially novel according to the invention is that the optical image transfer system includes mirroring means mounted in a screening casing centrally over the image screen of the VDU, the mirroring means co-acting with light refractive means and/or are formed for light refraction adjusted to the operator. This means that the VDU as well as the screening casing can be implemented so that the latter screens both incident light as well as injurious electromagnetic radiation.

The invention will now be described in details in connection with an embodiment illustrated on the accompanying drawing, where FIG. 1 is a perspective view of an apparatus in accordance with the invention, built into a desk;

FIG. 2 is a view from above of the apparatus illustrated in FIG. 1, to a different scale;

FIG. 3 is a partial section of the apparatus seen from the viewer, and its arrangement in the desk; and FIG. 4 is a section along the line IV—IV in FIG. 3.

AS SHOWN ON THE DRAWINGS

An apparatus in accordance with the invention is arranged set into a desk top 1. The apparatus comprises a plate 2 carrying a casing 3 provided with a screened-off opening 4, in which there is mounted a collimation lens 5. A mirror 7 is mounted in fastenings 6 on the inside of the casing under its ceiling surface, there being a further mirror 8 mounted in fastenings 9 and adjacent the lens 5 under the casing. A further casing 10 is suspended from the plate 2 and extends through a hole 11 in the desk top 1. The casing 10 surrounds the actual VDU, represented here by a schematically drawn cathode ray tube 12. In front of the opening 4 there is a wrist support 15 on an adjustable holder 14 attached by a hinged joint 13 to the plate 2, the holder being intended for an unillustrated keyboard associated with the VDT. The lines 16 indicate the direction of observation and the lines 16a, 16b and 16c denote a light ray path from the image on the screen of the VDU 12. It is pointed out here that the lens 5 is such that the observer sees the screen surface of the VDU as being at infinity, which means that if the eye is accommodated to infinity before observing the image, there is no further accommodation. Very restful viewing of the screen is thus obtained, and a person who needs bifocal spectacles to compensate for short sight, for example, can see the content of the screen with the "long sight" part of the spectacle lens, while notes, drafts and keys are seen with the "near sight" part of the lens. As indicated in FIG. 3 by dashed lines, note holders 17,18 can be mounted on either side of the opening 4. Due to the effective screening off of directly incident light on the VDU image screen, there is obtained viewing which is without disturbance and without dazzle.

In accordance with the invention the casing 3, i.e. the casing over the VDU image screen, and the casing 10 surrounding the VDU are both made from a radiation inhibiting material. By suitable material selection, magnetic fields as well as injurious electro magnetic radiation may thus be prevented from leaving the apparatus. This eliminates all previously discussed health risks, even if the operator were to sit very close to the apparatus, and also signifies effective protection against unauthorized scanning of revealing signals, since both casings effectively enclose any detectable wave propagation.

With the aid of the illustrated apparatus the operator obtains considerably improved viewing comfort compared with conventional terminals, greatly depending on the fact that the image content from the VDU is displayed with magnification and at infinity. The operator also experiences a better ergonomic situation in this connection, since the distance between the keyboard and display is very small and is substantially in the same direction. By moving down the VDU from sitting eye height, which is usual in conventional terminals, to form a part of an apparatus such as described above, there is obtained a comfortable viewing angle.

In the implementation of the apparatus described above it is easy to make the sunken fitting swivellably adjustable, i.e. so that the plate with its casings and keyboard holder may be turned relative the desk top. Within the scope of the invention, such embodiments are of course conceivable where the VDU, with both casings 3 and 10, is mountable in some other way than sunk into a desk top as illustrated. They may be suspended in a frame or other support, for example. Furthermore, it is not necessary in all connections to use a lens for obtaining correct image reproduction, and the mirrors, or one of them, can be envisaged as being curved to provide the same effect as the lens itself. Of course, one of the mirrors, e.g. the mirror 8, should be angularly adjustable so that correct adjustment to the VDU image screen may be achieved.

I claim:

1. An optical image transfer apparatus comprising:
   a video display unit having an image screen;
   image transfer means for transferring the image from said image screen to a viewer, said image transfer means having a means for directing the light rays from said image screen, said image transfer means also having a means for transporting said image from said image screen to said means for directing;
   casing means having at least two swivellably mounted sections, a first of said at least two sections for enclosing said image transfer means and a second of said at least two sections for enclosing said video display unit, said casing means being capable of screening-off light and radiation from said video display unit whereby said light rays are transmitted outside of said casing means to eliminate eye focusing by the viewer while preventing unauthorized viewing by another and the image is viewed by the viewer as being at infinity in a transverse direction with respect to said video display unit at a comfortable, safe distance from said video display unit.

2. The apparatus of claim 1, wherein said means for directing said image into non-parallel light rays is a collimator lens.

3. The apparatus of claim 1, wherein said means for transporting is comprised of at least two mirrors, said mirrors being arranged to reflect light from said image screen to said means for directing, said means for directing being capable of directing light rays to the exterior of said casing means in a direction oblique to said image screen.

4. The apparatus of claim 1, wherein said first and second casing sections are separated by a mounting plate having an aperture therethrough and said mounting plate is affixed to a desk top, said desk top having an aperture slightly larger than said aperture of said mounting plate, whereby said first section of said casing is placed on the top side of said mounting plate on the top side of said desk top and said second section of said casing is affixed to the bottom side of said mounting plate on the bottom of said desk top and said image from said image screen may be transmitted from the bottom side of said mounting plate through said apertures to the image transfer means on the top side of said mounting plate.

5. A video display terminal comprising:
   a video display unit having an image screen;
   a first casing means for enclosing said image screen, said first casing means being capable of screening-off light and radiation;
   a desk top, said desk top having an aperture slightly larger than said image screen;
   a mounting plate, said mounting plate having an aperture corresponding to the dimensions of said image screen, said mounting plate being affixed to the top side of said desk top with its aperture being centered wtih respect to said aperture of said desk top, said mounting plate further being affixed to said first casing means through said desk top aperture on the bottom side of said desk top;
   first and second mirror means arranged on the top side of said desk top for reflecting the image from said image screen;
   a second casing means for enclosing said first and second mirror means being capable of screening-off light and radiation, said second casing means being affixed to said mounting plate on the top side of said desk top directly above said aperture of said mounting plate, said first and second mirror means being angularly arranged within said second casings means, said first mirror means being closer to said image screen and said second mirror means being angularly adjustable;
   a collimator lens mounted in a side wall of said second casing means, said collimator lens being disposed in the light path of said image screen reflected by said first and second mirror means, said collimator lens being capable of transmitting light through said second casing to the exterior of said second casing in a direction oblique to said image screen, whereby the image from said image screen is transmitted through said apertures of said desk top and said mounting plate to said first and second mirror means which reflect the image to said collimator lens for transmitting the image to the outside of said casing so that the image will be viewed as being at infinity.

6. The apparatus of claim 5, wherein said first and second casing means are swivellably mounted to said desk top.

* * * * *